United States Patent
Jeong

(10) Patent No.: US 7,741,858 B2
(45) Date of Patent: Jun. 22, 2010

(54) CAPACITIVE SWITCH OF ELECTRIC/ELECTRONIC DEVICE

(75) Inventor: Hoi Jin Jeong, Changwon-si (KR)

(73) Assignee: LG Electronics Inc., Seoul (KR)

( * ) Notice: Subject to any disclaimer, the term of this patent is extended or adjusted under 35 U.S.C. 154(b) by 334 days.

(21) Appl. No.: 11/808,270

(22) Filed: Jun. 7, 2007

(65) Prior Publication Data

US 2007/0285872 A1 Dec. 13, 2007

(30) Foreign Application Priority Data

Jun. 9, 2006 (KR) ...................... 10-2006-0052132

(51) Int. Cl.
*G01R 27/26* (2006.01)
*H03K 17/975* (2006.01)
(52) U.S. Cl. ................... 324/661; 324/662; 200/600
(58) Field of Classification Search ................ 324/661, 324/662; 200/600
See application file for complete search history.

(56) References Cited

U.S. PATENT DOCUMENTS

| | | | | |
|---|---|---|---|---|
| 4,458,293 A * | 7/1984 | Cherry | ........................ | 341/33 |
| 4,467,150 A * | 8/1984 | Leitermann et al. | ......... | 200/5 A |
| 4,584,444 A * | 4/1986 | Nagashima | ................. | 200/600 |
| RE32,977 E * | 7/1989 | Gotoh et al. | ................. | 200/5 A |
| 5,917,165 A * | 6/1999 | Platt et al. | .................... | 200/600 |
| 6,057,521 A * | 5/2000 | Krebs et al. | ................. | 200/298 |
| 6,153,843 A * | 11/2000 | Date et al. | .................. | 200/339 |
| 6,373,265 B1 * | 4/2002 | Morimoto et al. | ........... | 324/686 |
| 6,752,551 B1 * | 6/2004 | Hagerman | ................... | 400/488 |
| 6,933,732 B2 * | 8/2005 | Morimoto | .................... | 324/661 |
| 6,958,614 B2 * | 10/2005 | Morimoto | .................... | 324/661 |
| 7,119,552 B2 * | 10/2006 | Morimoto et al. | ........... | 324/661 |
| 7,372,281 B2 * | 5/2008 | Morimoto | .................... | 324/661 |
| 7,375,536 B2 * | 5/2008 | Supper et al. | ............... | 324/661 |
| 7,579,569 B2 * | 8/2009 | Romanowski | ............. | 200/600 |
| 2005/0179673 A1 * | 8/2005 | Philipp | ....................... | 345/173 |
| 2006/0113178 A1 * | 6/2006 | Soma et al. | ................. | 200/600 |

FOREIGN PATENT DOCUMENTS

WO  WO 2006-034993  4/2006

* cited by examiner

*Primary Examiner*—Timothy J Dole
*Assistant Examiner*—John Zhu
(74) *Attorney, Agent, or Firm*—McKenna Long & Aldridge LLP

(57) ABSTRACT

A capacitive switch of an electric/electronic device is provided. The capacitive switch includes a plurality of contacts which are disposed at a front of a control panel; a plurality of capacitive sensors which are disposed at a rear of the control panel, respectively face the contacts, and detect capacitance variations caused by static electricity that affects the contacts; and a plurality of void removal elements which are respectively disposed between the capacitive sensors and the contacts, remove a plurality of voids between the capacitive sensors and the contacts, and are formed of an elastic material so as to be able to compensate for various sized voids. Therefore, it is possible to easily remove various sized voids between the contacts and the capacitive sensors using the void removal elements, to prevent malfunction of the capacitive sensors due to the existence of voids, and to provide various shapes of control panels and various shapes of printed circuit boards.

11 Claims, 6 Drawing Sheets

CAPACITIVE SWITCH OF ELECTRIC/ELECTRONIC DEVICE

This application claims priority from Korean Patent Application No. 10-2006-0052132 filed on Jun. 9, 2006 in the Korean Intellectual Property Office, the disclosure of which is incorporated herein by reference in its entirety.

BACKGROUND OF THE INVENTION

1. Field of the Invention

The present invention relates to a capacitive switch of an electric/electronic device, and more particularly, to a capacitive switch of an electric/electronic device which can easily remove a plurality of voids between a plurality of contacts and a plurality of capacitive sensors.

2. Description of the Related Art

Electric/electronic devices are generally equipped with a controller which can control an electric/electronic device to perform an operation desired by a user. A controller of an electric/electronic device generally includes a manipulation unit which manipulates an operation of the electric/electronic device according to user manipulation, a display unit which displays information regarding an operating state of the electric/electronic device, and a control unit which controls the operation of the electric/electronic device.

The manipulation unit is used to manipulate the operation of the electric/electronic device or to modify a control algorithm of the controller. The manipulation unit may include a plurality of manipulation switches which can receive various signals from a user. The manipulation switches may include press switches, slide switches, rotation switches, and touch switches.

Touch switches determine whether they are touched by a user, and operate according to the result of the determination. Examples of the touch switches include capacitive switches. Capacitive switches detect a capacitance variation caused by the static electricity of an object, and operate based on the result of the detection. Capacitive switches may include a plurality of contacts which are formed of a dielectric material at the exterior of a controller of an electric/electronic device and a plurality of capacitive sensors which are respectively attached onto the rear surfaces of the contacts. When a contact is touched by a user, the capacitance of the contact varies due to the static electricity of the user, and a capacitive sensor corresponding to the contact detects the variation in the capacitance of the contact. In this manner, the controller may control the electric/electronic device based on the result of detection performed by the capacitive sensors.

However, in the case of conventional capacitive switches, voids may be formed when either contacts or capacitive sensors are not uniformly arranged. In this case, the capacitive switches may malfunction due to the voids. In other words, if the controller has an uneven surface or the capacitive sensors have different heights, the capacitive sensors may not be properly attached onto the rear surfaces of the contacts, thereby generating voids between the contacts and the capacitive sensors.

In order to address this, the arrangement of the capacitive sensors may be altered according to the locations of the contacts. In this case, however, it is difficult to assemble a capacitive switch, and the amount of time required to assemble a capacitive switch may increase. If the capacitive sensors are formed have different heights, it is difficult to standardize elements for various capacitive sensors.

SUMMARY OF THE INVENTION

The present invention provides a capacitive switch of an electric/electronic device which can easily remove a plurality of voids between a plurality of contacts and a plurality of capacitive sensors.

The present invention also provides a capacitive switch of an electric/electronic device which can easily remove a plurality of voids between a plurality of contacts and a plurality of capacitive sensors and can thus prevent malfunction of the capacitive sensors and dispose the capacitive sensors or the contacts at various locations.

According to an aspect of the present invention, there is provided a capacitive switch of an electric/electronic device, including a plurality of contacts which are disposed at a control panel; a plurality of capacitive sensors which are disposed at a rear of the control panel, respectively face the contacts, and detect capacitance variations caused by static electricity that affects the contacts; and a plurality of void removal elements which are respectively disposed between the capacitive sensors and the contacts, remove a plurality of voids between the capacitive sensors and the contacts, and are formed of an elastic material so as to be able to compensate for various sized voids.

First ends of the void removal elements may be respectively fixed to the capacitive sensors or the contacts, and second ends of the void removal elements may be respectively attached elastically to whichever of the capacitive sensors and the contacts are not connected to the first ends of the void removal elements.

Alternatively, first ends of the void removal elements may be respectively fixed to the capacitive sensors or the contacts, and second ends of the void removal elements may be respectively fixed to whichever of the capacitive sensors and the contacts are not connected to the first ends of the void removal elements.

Each of the void removal elements may include a plate spring or a coil spring.

A size of the void removal elements may be greater than any of sizes of the plurality of voids.

The contacts may be formed of a dielectric material, and the void removal elements may be formed of a conductive material.

The void removal elements may be incorporated with the control panel.

The void removal elements may be respectively incorporated with the capacitive sensors.

Part of the control panel may have a flat curved surface. In this case, at least two contacts may be disposed on the flat curved surface of the control panel so that various sized voids can be formed, and the degree to which the void removal elements are elastically compressed between the capacitive sensors and the contacts may vary according to the sizes of the plurality of voids.

Part of the control panel may have an uneven surface with step differences. In this case, at least two contacts may be disposed on the uneven surface of the control panel so that various sized voids can be formed, and the degree to which the void removal elements are elastically compressed between the capacitive sensors and the contacts may vary according to the sizes of the plurality of voids.

At least two capacitive sensors may have different heights so that various sized voids can be formed, and the degree to which the void removal elements are elastically compressed between the capacitive sensors and the contacts may vary according to the sizes of the plurality of voids.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

The present invention will hereinafter be described in detail with reference to the accompanying drawings in which exemplary embodiments of the invention are shown.

Figure 1:
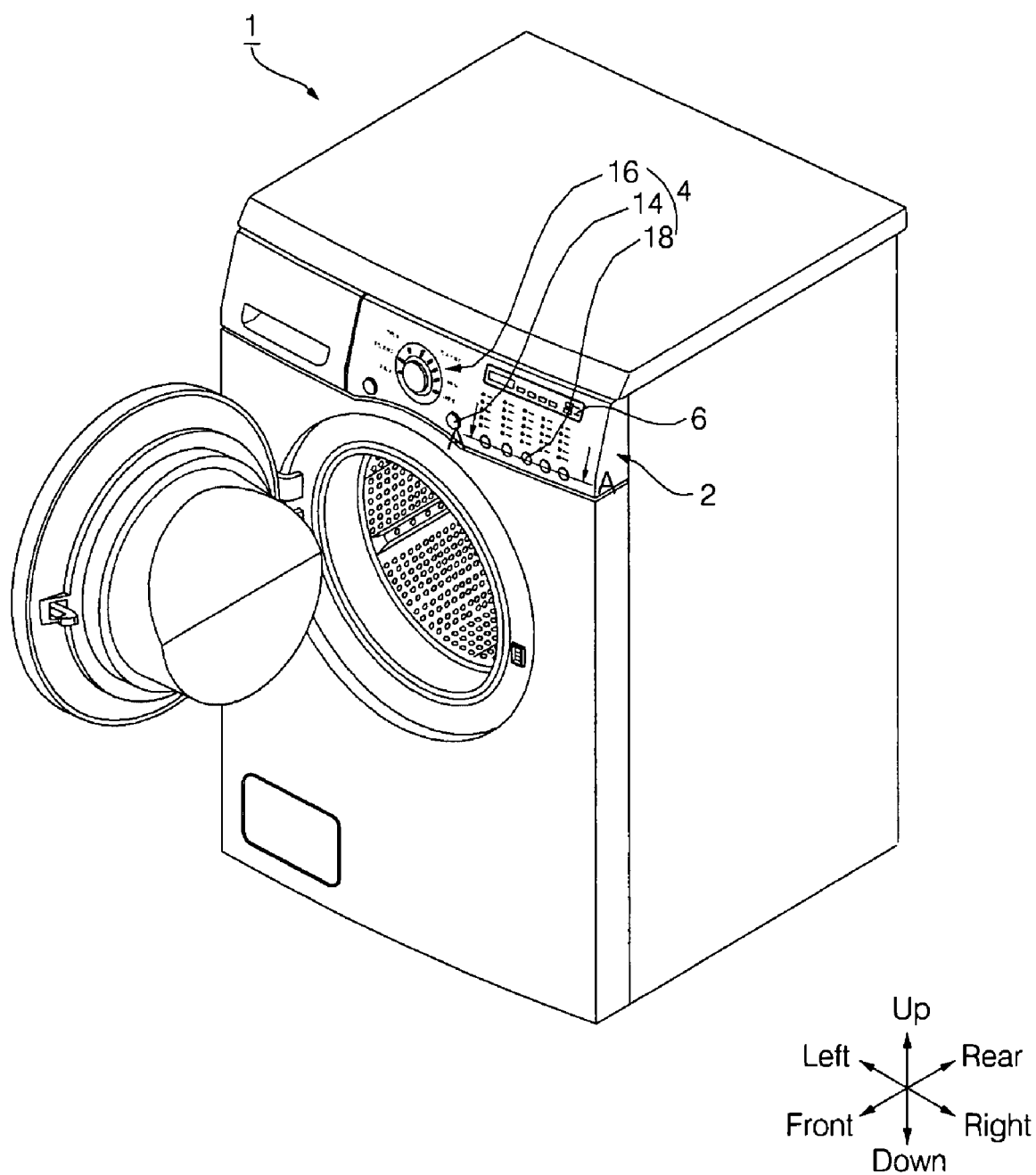
FIG. 1 is a perspective view of a washing machine equipped with a capacitive switch according to an embodiment of the present invention.
Figure 2:
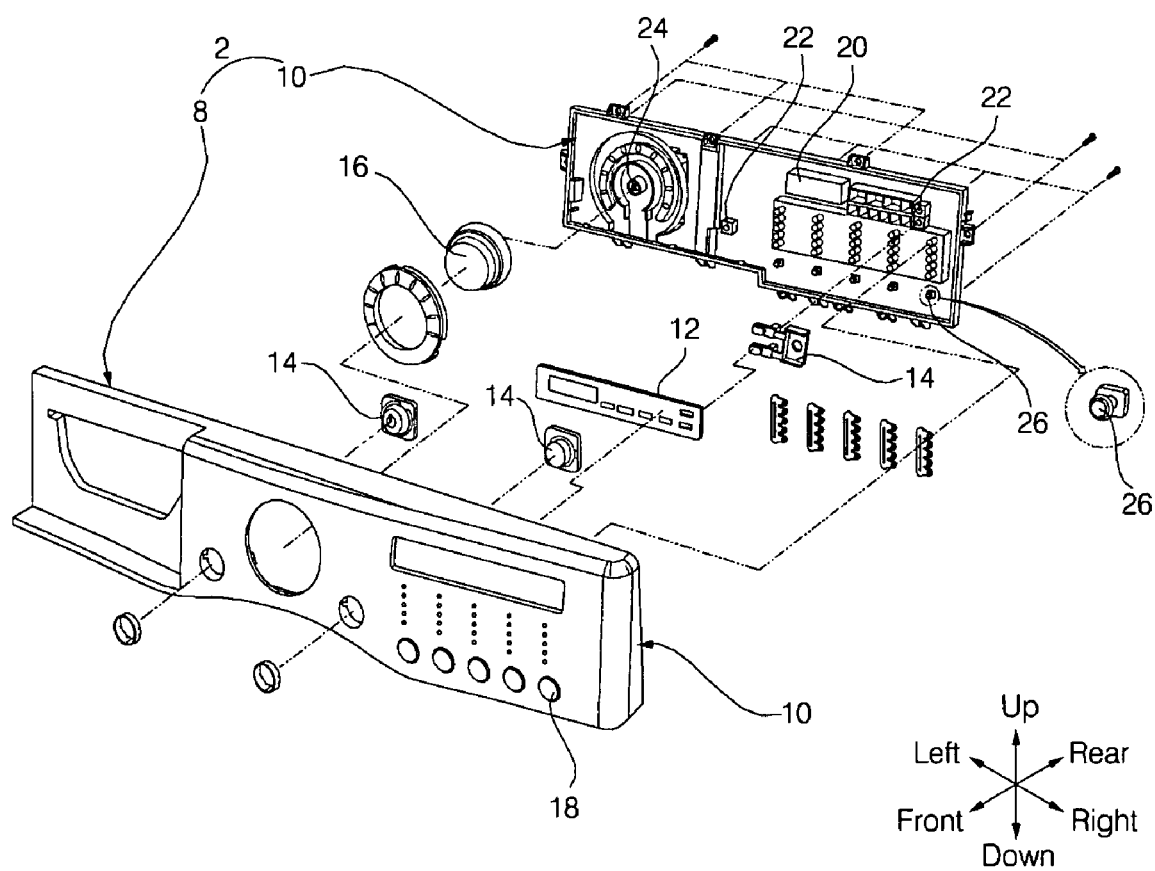
FIG. 2 is an exploded perspective view of a controller illustrated in FIG. 1.
Figure 3:
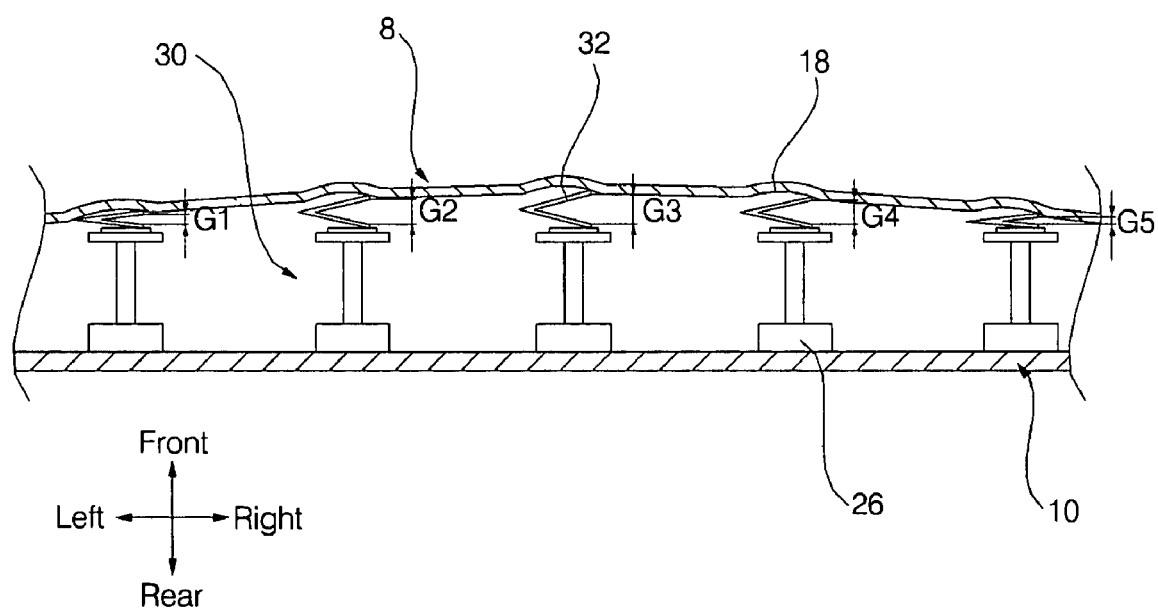
FIG. 3 is a cross-sectional view taken along line A-A of FIG. 1.
Figure 4:
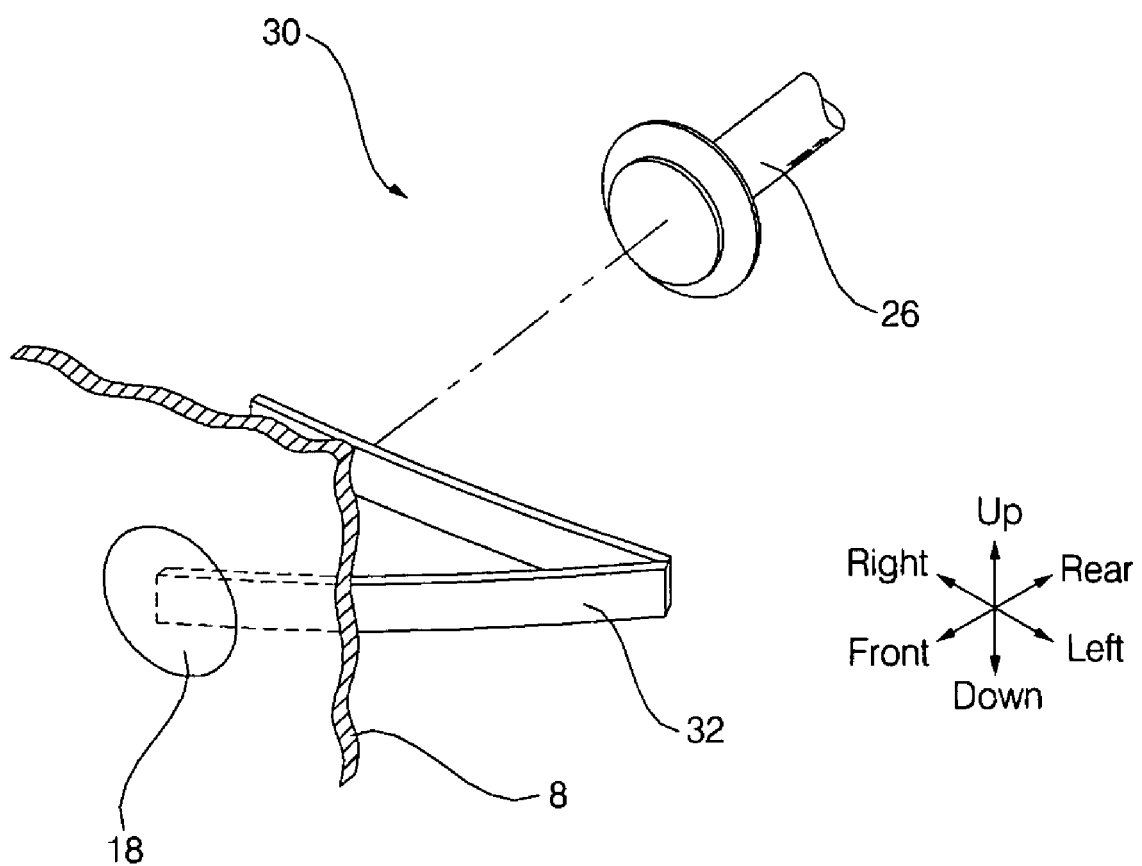
FIG. 4 is an exploded perspective view of the capacitive switch illustrated in FIG. 1.
Figure 5:
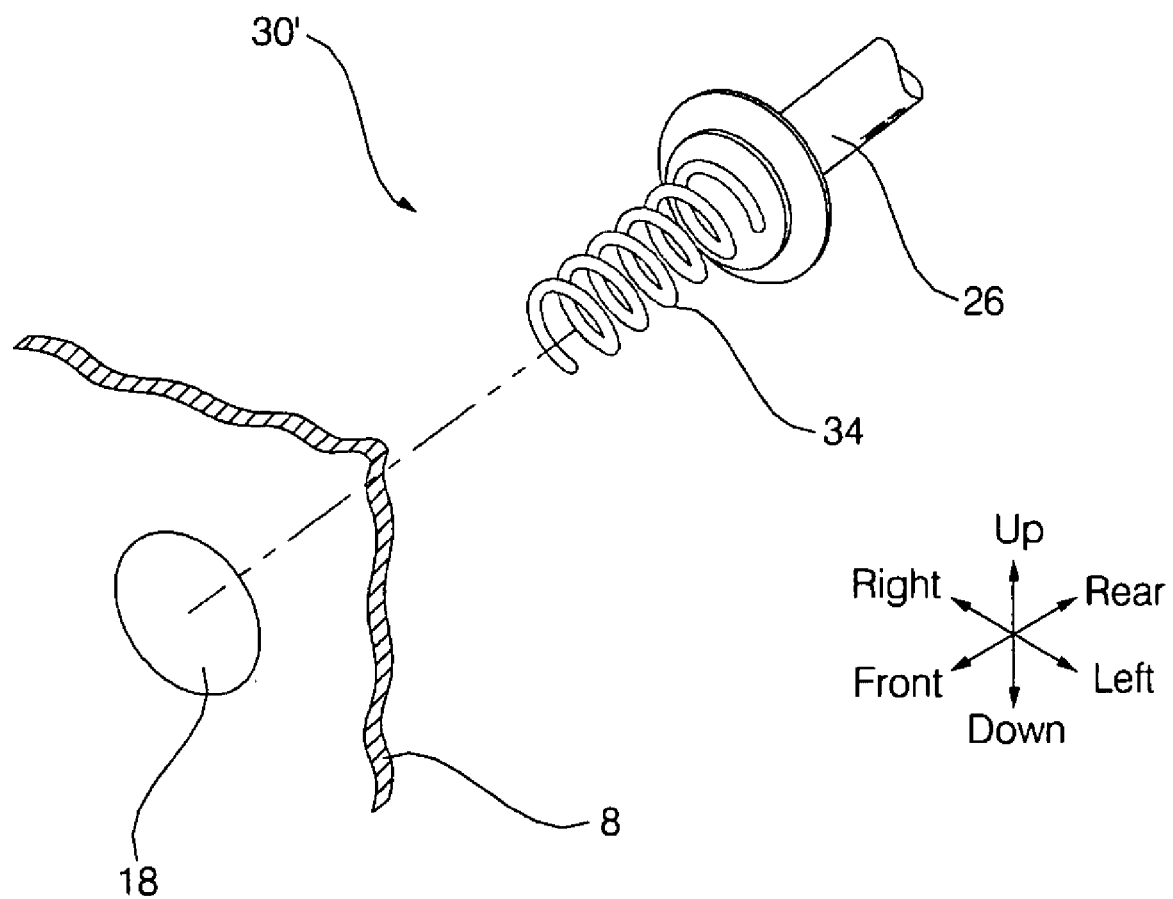
FIG. 5 is an exploded perspective view of a capacitive switch according to another embodiment of the present invention.

FIG. 1 is a perspective view of a washing machine 1 equipped with a capacitive switch 30 according to an embodiment of the present invention. FIG. 2 is an exploded perspective view of a controller 2 illustrated in FIG. 1. FIG. 3 is a cross-sectional view taken along line A-A of FIG. 1. FIG. 4 is an exploded perspective view of the capacitive switch 30 illustrated in FIG. 1. FIG. 5 is an exploded perspective view of a capacitive switch 30' according to another embodiment of the present invention, which is a variation of the capacitive switch 30 illustrated in FIG. 1. More specifically, FIGS. 1 and 2 illustrate the washing machine 1 including the capacitive switch 30 and the controller 2.

Referring to FIG. 1, the controller 2 is installed at the front of an upper portion of the washing machine 1. The controller 2 is necessary for manipulating and controlling an operation of the washing machine 1 and displaying information regarding an operating state of the washing machine 1. The controller 2 includes a manipulation unit 4 which manipulates the operation of the washing machine 1, a display unit 6 which displays information regarding the operating state of the washing machine 1, and a control unit (not shown) which controls the operation of the washing machine. That is, the operation of the washing machine 1 is manipulated by the manipulation unit 4, and information regarding an operating state of the washing machine 1 is displayed by the display unit 6. The manipulation unit 4 includes a number of manipulation switches for receiving various signals generated by a user's manipulation of the manipulation switches.

Referring to FIGS. 1 and 2, the controller 2 includes a control panel 8 which is mounted on the upper portion of the washing machine 1 so as to be able to be attached to or detached from the washing machine 8 and forms the exterior of the controller 2; and a printed circuit board 10 which is installed inside the control panel 8 and on which various elements of the control unit of the controller 2 are mounted.

A transparent window 12 is provided on the control panel 8 and is formed of a transparent material. Also, a key input unit of the manipulation unit 4 is provided on the control panel 8. The key input unit includes a plurality of buttons 14 which can be pressed down on the control panel 8 and a plurality of contacts 18 which are incorporated with the control panel 8.

The printed circuit board 10 includes a display element 20 which faces the transparent window 12, a plurality of tact switches 22 which face the respective buttons 14, an encoder 24 which faces a knob 16, and a plurality of capacitive sensors 26 which face the respective contacts 18. The display element is an element for displaying information such as a liquid crystal display (LCD) or a light-emitting diode (LED). The display element 20 displays information regarding the operating state of the washing machine 1 to a user through the transparent window 12. The transparent window 12 and the display element 20 constitute the display unit 6. The tact switches 22 and the buttons 14 are press switches. The tact switches 22 are turned on or off according to whether the respective buttons 14 are pressed. The encoder 24 and the knob 16 are rotating switches. The encoder 24 may generate various control signals according to the rotation angle of the knob 16.

Referring to FIGS. 3 and 4, the capacitive switch 30 includes the contacts 18 which enable static electricity to flow into the control panel 8; the capacitive sensors 26 which are disposed at the rear of the control panel 8, face the respective contacts 18, detects capacitance variations caused by static electricity that affects the contacts 18; and a plurality of void removal elements 32 which are respectively disposed between the capacitive sensors 26 and the contacts 18 and can thus remove various sized voids G1, G2, G3, G4, and G5 between the capacitive sensors 26 and the contacts 18.

Referring to FIGS. 2 and 3, part of the control panel 8 may have a flat curved surface or an uneven surface with step differences for enhancing the exterior beauty of the washing machine 1 and facilitating the design of the washing machine 1. At least two contacts 18 may be formed on a flat curved surface or an uneven surface of the control panel 8, thereby forming various sized voids, i.e., the voids G1, G2, G3, G4, and G5, under the contacts 18. For convenience, assume that part of the control panel 8 may have a flat curved surface, and that the contacts 18 are formed on the flat curved surface of the control panel 8.

The contacts 18 are incorporated with the control panel 8, and respectively face the capacitive sensors 26. The control panel 8 is formed of a dielectric material using an injection molding method. The contacts 18 are formed in one body with the control panel 8 during an injection molding operation for forming the control panel 8. The contacts 18 are formed to such a thickness that the capacitance of the contacts 18 can vary according to static electricity generated when the user touches the contacts 18. When the capacitance of the contacts 18 varies due to the static electricity generated by the user, the capacitive sensors 26 detect the variation in the capacitance of the contacts 18. In order to visualize the functions and locations of the capacitive switches 30, a predetermined pattern may be printed on the top surfaces of the contacts 18, respectively. In order for the user to easily identify the locations of the capacitive switches 30 with his/her senses of vision and touch, the contacts 18 may protrude or may be recessed from the top of the control panel 8. For convenience, assume that the contacts 18 protrude from the top of the control panel 8.

Referring to FIGS. 3 and 4, the capacitive sensors 26 are sensors that detect a variation in the capacitance of the contacts 18 with the aid of the void removal elements 32. The capacitive sensors 26 are formed to the same height at the front of the printed circuit board 10, and face the respective contacts 18. Therefore, various sized voids, i.e., the voids G1, G2, G3, G4, and G5, may be formed, and the sizes of the voids G1, G2, G3, G4, and G5 may be determined according to the locations of the respective contacts 18 on the flat curved surface of the control panel 8.

Referring to FIGS. 3 and 4, the void removal elements 32 are formed of a conductive material, and are respectively disposed elastically between the contacts 18 and the capacitive sensors 26. In other words, in order to compensate for the differences between the sizes of the voids G1, G2, G3, G4, and G5, the void removal elements 32 may be formed of an elastic conductive material. Each of the void removal elements 32 includes a plate spring. First ends of the plate springs of the void removal elements 32 respectively contact the contacts 18, and second ends of the plate springs of the void removal elements 32 respectively contact the capacitive sensors 26. Since the void removal elements 32 are highly elastically deformable, the void removal elements 32 can remove various sized voids and the differences between the sizes of the various sized voids.

First ends of the void removal elements 32 are fixed onto the rear surfaces of the contacts 18, and second ends of the void removal elements 32 are elastically attached onto the front surfaces of the capacitive sensors 26. By fixing the first ends of the void removal elements 32 onto the rear surfaces of the contacts 18, the control panel 8 and the void removal elements 32 can be incorporated into a single element module. The size of the void removal elements 32 is greater than any of the sizes of the voids G1, G2, G3, G4, and G5. The void removal elements 32 are elastically compressed between the contacts 18 and the capacitive sensors 26. The degree to which the void removal elements 32 are elastically compressed varies according to the sizes of the voids G1, G2, G3, G4, and G5. Alternatively, the first ends of the void removal elements 32 may be fixed onto the rear surfaces of the contacts 18, and the second ends of the void removal elements 32 may be fixed onto the front surfaces of the capacitive sensors 26.

The assembly and the operation of the capacitive switch 30 illustrated in FIG. 1 will hereinafter be described in detail.

An LED, the tact switches 22, the display element 20, the encoder 24, the knob 16, and the capacitive sensors 26 are installed at the front of the printed circuit board 10. Then, the transparent window 12 is installed at the control panel 8, the buttons 14 are installed at the control panel 8 so as to be able to be pressed down on the control panel 8, and the first ends of the void removal elements 32 are fixed onto the rear surfaces of the contacts 18, which are formed on the control panel 8 and face the respective capacitive sensors 26. The void removal elements 32 and the control panel 8 may be incorporated into a single element module, thereby increasing the convenience of assembly.

Thereafter, the printed circuit board 10 is mounted on the rear of the control panel 8, thereby completing the assembly of the controller 2. The display element 20 is disposed at the rear of the display unit 6, and the tact switches 22 are disposed at the rear of the respective buttons 15. The knob 16 is formed through the control panel 8 so as to be able to rotate, and the capacitive sensors 26 are firmly attached to the second ends of the void removal elements 32.

Even when part of the control panel 8 has a flat curved surface and the capacitive sensors 26 are formed to the same height on the printed circuit board 10, various sized voids between the contacts 18 and the capacitive sensors 26, i.e., the voids G1, G2, G3, G4, and G5, may all be effectively removed by the void removal elements 32.

When the user touches one of the contacts 18, the static electricity of the user varies the capacitance of the touched contact 18, and the variation in the capacitance of the touched contact 18 is transmitted to a capacitive sensor 26 corresponding to the touched contact 18 via a void removal element 32 corresponding to the touched contact 18. Once the variation in the capacitance of the touched contact 18 is detected by the capacitive sensor 26 corresponding to the touched contact 18, a control signal corresponding to whichever of the capacitive sensors 26 corresponds to the touched contact 18 is output to the control unit of the controller 2.

The void removal elements 32 can completely remove the voids G1, G2, G3, G4, and G5 between the control panel 8 and the capacitive sensors 26. Thus, it is possible to provide various shapes of control panels 8 and thus to enhance the exterior beauty of the washing machine 1 and facilitate the design of the washing machine. In addition, the void removal elements 32 can prevent the capacitive sensors 26 from malfunctioning due to the voids G1, G2, G3, G4, and G5. Thus, it is possible to ensure the operating reliability of the capacitive switch 30. Moreover, the void removal elements 32 can be implemented through simple modifications to existing capacitive switches. Thus, it is possible to easily apply the void removal elements 32 to various capacitive switches and thus to standardize elements for various capacitive switches.

Referring to the capacitive switch 30' illustrated in FIG. 5, a void removal element 34 is formed as a spring, and is disposed between a contact 18 and a capacitive sensor 26. The void removal element 34 can remove a void between the contact 18 and the capacitive sensor 26. A first end of the void removal element 34 is respectively fixed onto the front surface of the capacitive sensor 26, and a second end of the void removal element 34 is elastically attached onto the rear surface of the contact 18. By fixing the first end of the void removal element 32 onto the rear surface of the capacitive sensor 26, the capacitive sensor 26 and the void removal element 32 can be incorporated into a single element module.

Figure 6:
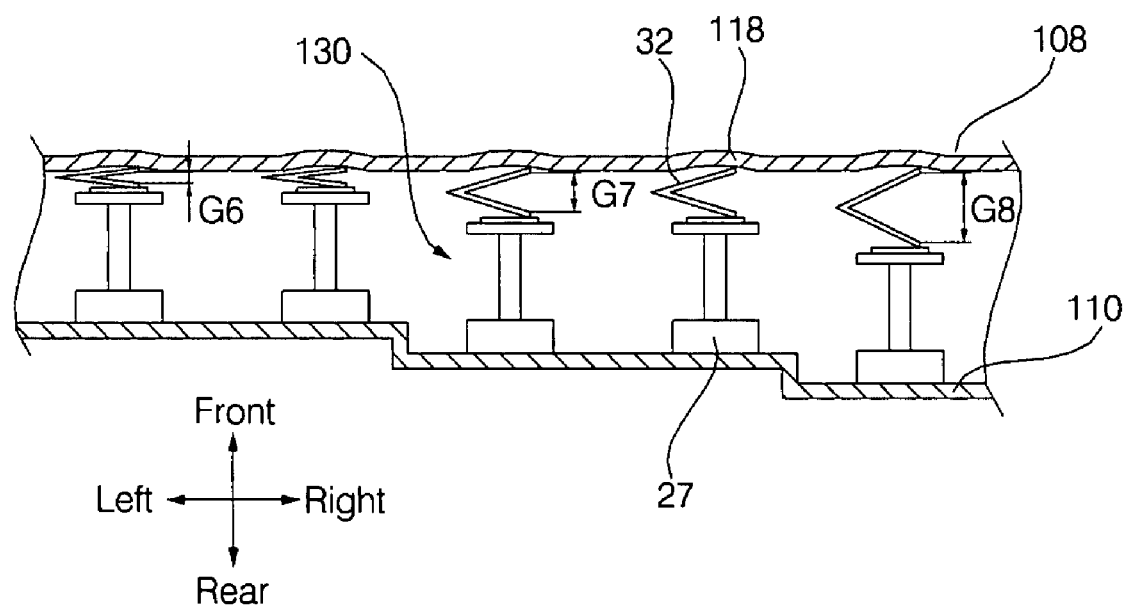
FIG. 6 is an exploded perspective view of a capacitive switch according to another embodiment of the present invention.

FIG. 6 is a cross-sectional view of a capacitive switch 130 according to another embodiment of the present invention. In FIGS. 3 and 6, like reference numerals represent like elements, and the structure of the capacitive switch 130 will hereinafter be described in detail, focusing mainly on the differences with the capacitive switch 30 illustrated in FIG. 3.

Referring to the capacitive switch 130 illustrated in FIG. 6, a printed circuit board 110 has an uneven surface with step differences, and a control panel 108 has a flat, even surface. Therefore, voids G6, G7, and G8 between a plurality of capacitive sensors 27 and a plurality of contacts 118 may have different sizes from one another because of the locations of the respective capacitive sensors 27 on the printed circuit board 110. The voids G6, G7, and G8 may be removed by a plurality of void removal elements 32.

As described above, since various sized voids can be removed by the void removal elements 32, it is possible to provide various shapes of control panels or printed circuit boards. According to an embodiment of the present invention, the void removal elements 32 may be applied to a controller 2 including at least two capacitive sensors 26 with different heights.

The capacitive switch according to the present invention may be applied to various electric/electronic devices, other than washing machines.

As described above, according to the present invention, a plurality of void removal elements are respectively disposed between a plurality of contacts and a plurality of capacitive sensors of a control panel and can thus effective remove various sized voids between the contacts and the capacitive sensors.

In addition, according to the present invention, it is possible to prevent the capacitive sensors from malfunctioning due to voids and thus to improve the operating reliability of a capacitive switch. Moreover, it is possible to apply the void removal elements to various capacitive switches and to standardize elements for various capacitive switches.

Furthermore, according to the present invention, it is possible to provide various shapes of control panels or printed circuit boards and to enhance the exterior beauty of a controller and facilitate the design of a controller by installing at least two capacitive sensors having different heights.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A capacitive switch of an electric/electronic device, comprising:
    a plurality of contacts which are disposed at a front of a control panel;
    a plurality of capacitive sensors which are disposed at a rear of the control panel, respectively face the contacts, and detect capacitance variations caused by static electricity transmitted through the contacts; and
    a plurality of void removal elements which are respectively disposed between the capacitive sensors and the contacts, to remove a plurality of voids between the capacitive sensors and the contacts and electrically connect the capacitive sensors and the contacts, and are formed of a conductive elastic material,
    wherein part of the control panel has a flat curved surface, at least two contacts are disposed on the flat curved surface of the control panel so that various sized voids are formed, and the degree to which the void removal elements are elastically compressed between the capacitive sensors and the contacts varies according to the sizes of the plurality of voids.

2. The capacitive switch of claim 1, wherein first ends of the void removal elements are respectively fixed to the capacitive sensors or the contacts, and second ends of the void removal elements are respectively attached elastically to whichever of the capacitive sensors and the contacts are not connected to the first ends of the void removal elements.

3. The capacitive switch of claim 2, wherein each of the void removal elements comprises a plate spring or a coil spring.

4. The capacitive switch or claim 3, wherein a size of the void removal elements is greater than any of sizes of the plurality of voids.

5. The capacitive switch of claim 1, wherein first ends of the void removal elements are respectively fixed to the capacitive sensors or the contacts, and second ends of the void removal elements are respectively fixed to whichever of the capacitive sensors and the contacts are not connected to the first ends of the void removal elements.

6. The capacitive switch of claim 5, wherein each of the void removal elements comprises a plate spring or a coil spring.

7. The capacitive switch of claim 1, wherein the contacts are formed of a dielectric material.

8. The capacitive switch of claim 1, wherein the void removal elements are formed integrally with the control panel.

9. The capacitive switch of claim 1, wherein the void removal elements are formed integrally with the capacitive sensors.

10. A capacitive switch of an electric/electronic device, comprising:
    a plurality of contacts which are disposed at a front of a control panel;
    a plurality of capacitive sensors which are disposed at a rear of the control panel, respectively face the contacts, and detect capacitance variations caused by static electricity transmitted through the contacts; and
    a plurality of void removal elements which are respectively disposed between the capacitive sensors and the contacts to remove a plurality of voids between the capacitive sensors and the contacts and electrically connect the capacitive sensors and the contacts, and are formed of a conductive elastic material,
    wherein part of the control panel has an uneven surface with step differences, at least two contacts are disposed on the uneven surface of the control panel so that various sized voids are formed, and the degree to which the void removal elements are elastically compressed between the capacitive sensors and the contacts varies according to the sizes of the plurality of voids.

11. A capacitive switch of an electric/electronic device, comprising:
    a plurality of contacts which are disposed at a front of a control panel;
    a plurality of capacitive sensors which are disposed at a rear of the control panel, respectively face the contacts, and detect capacitance variations caused by static electricity transmitted through the contacts; and
    a plurality of void removal elements which are respectively disposed between the capacitive sensors and the contacts to remove a plurality of voids between the capacitive sensors and the contacts and electrically connect the capacitive sensors and the contacts, and are formed of a conductive elastic material,
    wherein at least two capacitive sensors are placed at different heights so that various sized voids are formed, and the degree to which the void removal elements are elastically compressed between the capacitive sensors and the contacts varies according to the sizes of the plurality of voids.

* * * * *